United States Patent

[19]

Herzl

[11] 3,992,680

[45] Nov. 16, 1976

[54] PRECISION TEST FREQUENCY GENERATOR

[75] Inventor: Peter J. Herzl, Morrisville, Pa.

[73] Assignee: Fischer & Porter Company, Warminster, Pa.

[22] Filed: July 30, 1975

[21] Appl. No.: 600,318

[52] U.S. Cl. ................................. 331/61; 331/51; 328/14; 328/186
[51] Int. Cl.² ........................................ H03B 19/00
[58] Field of Search .................... 328/186, 14, 165; 331/51, 61

[56] References Cited
UNITED STATES PATENTS

| | | | |
|---|---|---|---|
| 3,532,972 | 10/1970 | Wolfendale | 328/165 |
| 3,581,212 | 5/1971 | McMurray | 328/186 |
| 3,657,657 | 4/1972 | Jefferson | 328/186 |
| 3,714,461 | 1/1973 | Dodson | 328/186 |
| 3,735,269 | 5/1973 | Jackson | 328/186 |

Primary Examiner—John Kominski

[57] ABSTRACT

A precision test frequency generator capable of selectively providing a sinusoidal output wave within a frequency range simulating the output of a flowmeter yielding a sinusoidal signal whose frequency is proportional to flow rate, the signal having a noise component superimposed thereon. The generator is constituted by a stable high-frequency standard coupled to a selectable output counter providing intermediate-frequency pulses whose repetition rate is a submultiple of the high-frequency standard and a predetermined multiple of the desired output frequency of the generator. The pulses are converted into a triangular wave whose frequency corresponds to the desired output frequency, the triangular wave having a staircase formation whose number of steps is determined by the multiple. The triangular wave is converted into a sinusoidal wave of the same frequency with a staircase modulation component simulating the flowmeter output signal.

7 Claims, 5 Drawing Figures

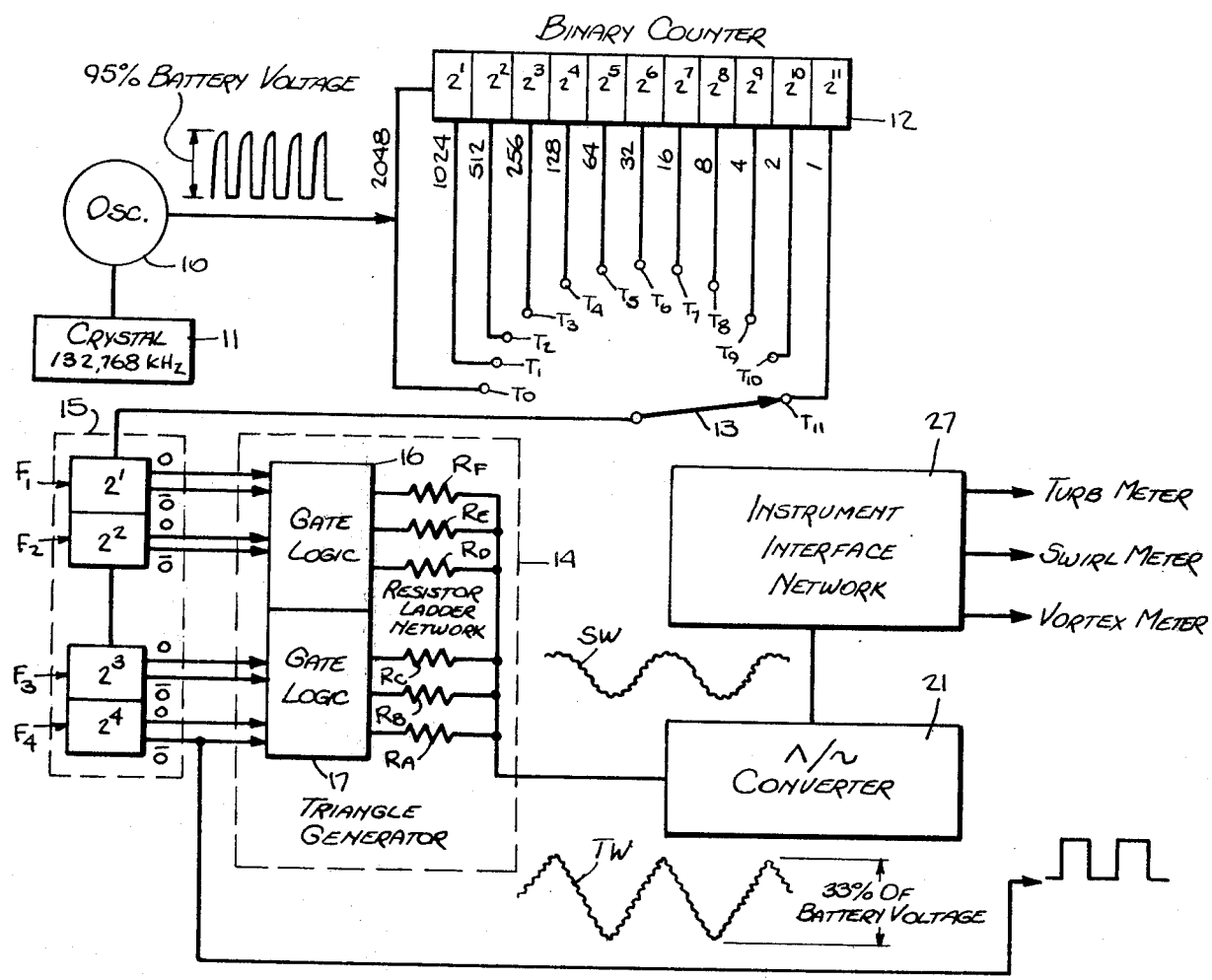
Fig.1.
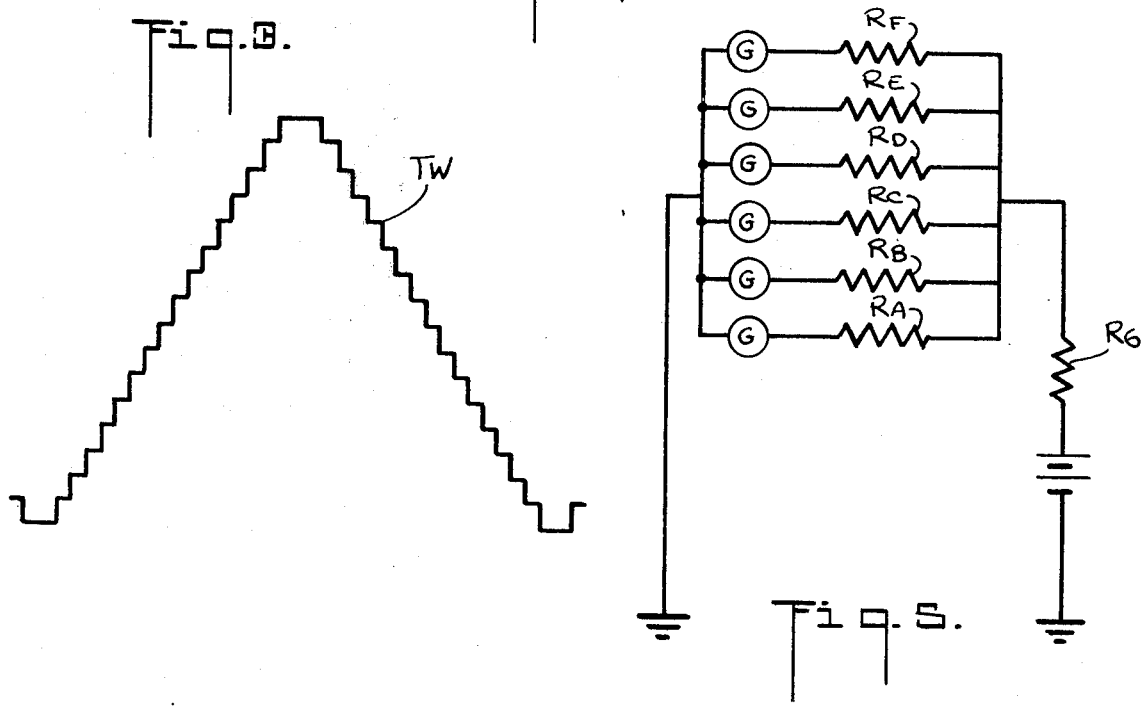
Fig.3.
Fig.5.

3,992,680

PRECISION TEST FREQUENCY GENERATOR

BACKGROUND OF INVENTION

This invention relates generally to precision sinusoidal wave test generators, and more particularly to a generator adapted to function as an accurate frequency source for checking and calibrating flowmeters.

In measuring flow rate, it is known to use turbine meters for this purpose, the meter including a turbine blade rotor mounted in a flow tube and actuated by the liquid flowing through the tube. A permanent magnet mounted on the rotor induces an alternating-current in a coil external to the tube, the frequency of the generated signal being proportional to the volumetric flow rate.

For measuring flow rate, it is also known to use vortex-shedding meters of the type disclosed in U.S. Pat. No. 3,116,639, in which an obstacle placed in a flow conduit creates fluidic oscillations whose frequency depends on flow rate. These oscillations are sensed to produce corresponding electrical signals. In Swirlmeters, such as the meter described in U.S. Pat. No. 3,279,251, the fluid to be measured is forced through stationary swirl blades to assume a swirl component which is transformed into precessional movement to create a vortex, the vortex being sensed to produce a signal whose frequency is indicative of flow rate.

Flowmeters of the type which produce a signal whose frequency is proportional to flow rate generally includes so-called secondary instruments adapted to convert the output signal from the primary of the meter into a corresponding current with a prescribed range suitable for industrial process control, the customary current range being 4 to 20 mA. The span of the current range is usually set so that a 20 mA output, the upper end of the range, is developed in response to a specific value of flow, say 1000 gallons per minute. This current output represents a particular signal frequency in the output of the meter primary.

In order to check and calibrate the span of the current output in the secondary of the flowmeter, one requires a precision frequency source capable of simulating the output signal of the flowmeter. Thus if signal frequencies corresponding to a 4 to 20 mA span lie in a range of 1 to 2000 Hz, then the test generator must be capable of producing an output having precise frequencies extending through the flowmeter signal range. Moreover, since nearly all flowmeters generate sinusoidal waves with a certain amount of noise superimposed thereon and in various amplitudes, in order to simulate these flowmeter signals, the test generator must be capable of producing a comparable sinusoidal wave having a noise component.

A further practical requirement for a test generator for flowmeters is that it be portable and battery-operated, for the tests are usually carried out in the field rather than in the factory. Hence, high-quality precision generators of the type available in many industrial laboratories, apart from the fact that they are complicated and costly instruments, are unsuitable for field use in that these generators are relatively bulky and operate from commercial power lines. Moreover, even if such high-quality test generators lent themselves to field use, they would still be unsuitable for purposes of checking and calibrating flowmeters in that they provide pure sine waves without a significant noise content. In other words, the normally commendable qualities of these precision generators preclude their use for flowmeter testing where the desideratum is an impure sinusoidal wave.

Also commercially available are relatively low-cost sine wave generators and frequency synthesizers. While such instruments are capable of generating sine waves, their frequency accuracy is poor or marginal and they cannot be trusted to check and calibrate a flowmeter. Also such inexpensive generators produce relatively clean sine waves and do not fully simulate flowmeter signals.

SUMMARY OF INVENTION

In view of the foregoing, the main object of this invention is to provide a precision test generator for selectively producing sinusoidal waves having a noise component in a predetermined frequency range, which waves accurately simulate the output signal of a flowmeter in that range.

More particularly, an object of this invention is to provide an efficient and reliable test generator of the above-noted type which is of simple and inexpensive design. A significant feature of the invention is that the generator requires relatively little power and thereby lends itself to construction as a battery-operated portable unit convenient for field use.

Yet another object of this invention is to provide a test generator whose output frequencies are derived from a highly-stable high-frequency standard to produce accurate output frequencies, making it possible to check and calibrate a flowmeter.

Briefly stated, these objects are accomplished in a test generator producing output frequencies within a predetermined range which accurately simulates the output signal of a flowmeter in that range, the generator including a high-frequency crystal oscillator serving as a high-stable standard. The crystal oscillator is coupled to a selectable or programmable counter yielding intermediate frequency pulses whose rate is a sub-multiple of the oscillator frequency and a predetermined multiple of the desired generator output frequency.

The pulses from the counter are converted into a triangular wave having a staircase formation, the frequency of the wave corresponding to the desired generator output frequency, the number of steps in the wave being determined by said multiple. Finally, the triangular wave is transformed into a sinusoidal wave of the same frequency with a staircase modulation component simulating the output signal of a flowmeter.

OUTLINE OF DRAWINGS

For a better understanding of the invention as well as other objects and further features thereof, reference is made to the following detailed description to be read in conjunction with the accompanying drawings, wherein:

FIG. 1 is a block diagram of a preferred embodiment of a precision test generator in accordance with the invention;

FIG. 3 illustrates a single triangular wave;

FIG. 5 is an equivalent circuit of the triangle generator.

DESCRIPTION OF INVENTION

Figure 2:
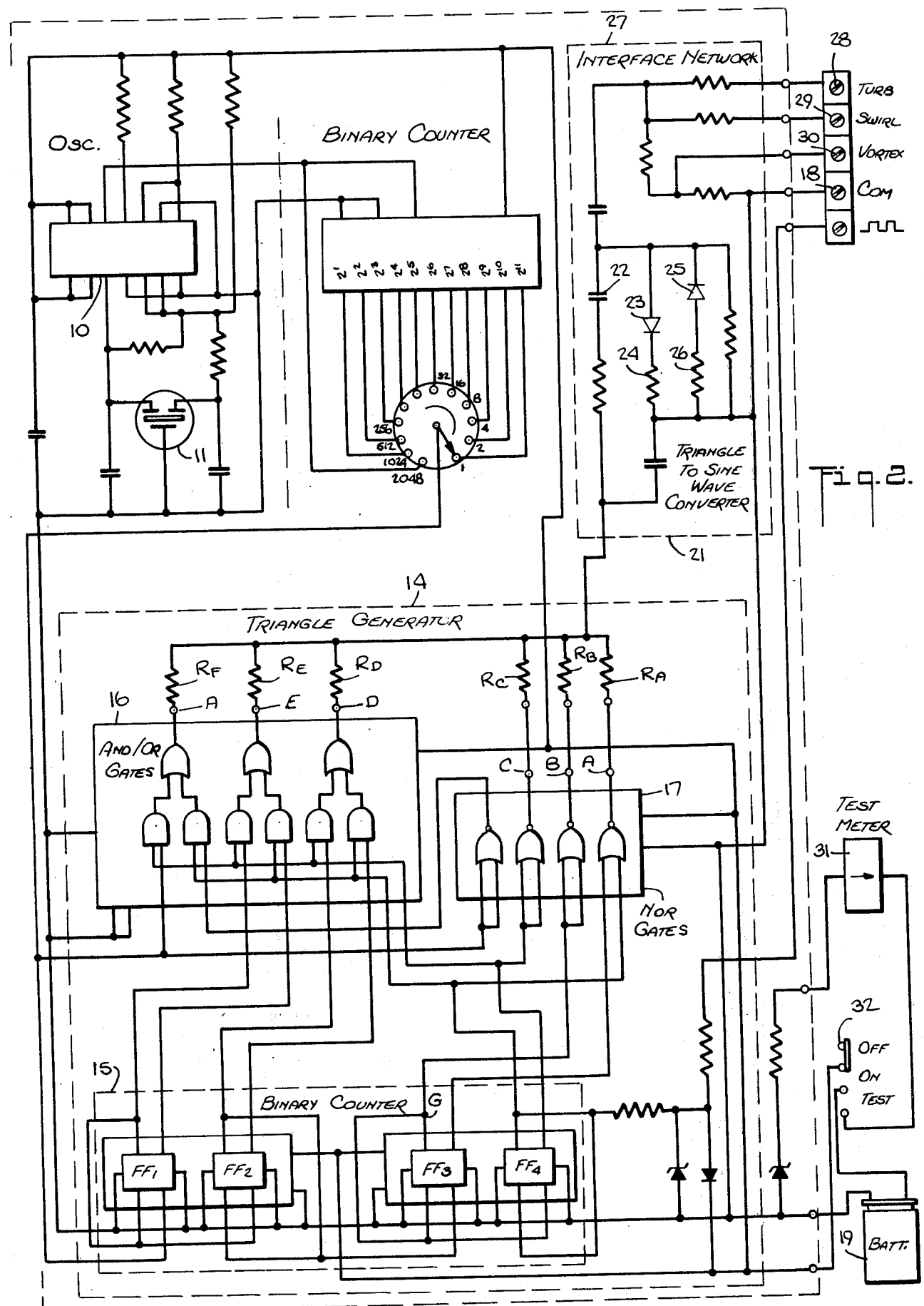
FIG. 2 is a schematic circuit diagram of the generator.

Referring now to FIGS. 1 and 2, there is shown a precision test generator in accordance with the invention, which includes a high-frequency oscillator 10, controlled and stabilized by a crystal 11, whereby the oscillator functions as a frequency standard or reference. In an actual working embodiment, the assigned crystal frequency is 32,768 Hz; hence the generator will be described as it operates using this high-frequency as the standard. It will be appreciated, however, that in practice other frequencies may be used as the standard.

The output of oscillator 10 is fed to a multi-stage binary counter 12 or divider which, in the example shown, has 11 stages in cascade relation, each dividing by a factor of 2. Thus the frequency at terminal $T_0$ at the counter input is 32,768 Hz; at terminal $T_1$ coupled to stage $2^1$ of the counter, the frequency is 16,384 Hz; at terminal $T_2$ coupled to stage $2^2$, it is 8,192 Hz; at terminal $T_3$ coupled to stage $2^3$, it is 4096 Hz; at terminal $T_4$ coupled to stage $2^4$, it is 2048 Hz; at terminal $T_5$ coupled to stage $2^5$, it is 1024 Hz; at terminal $T_6$ coupled to stage $2^6$, it is 512 Hz; at terminal $T_7$ coupled to stage $2^7$, it is 256 Hz; at terminal $T_8$ coupled to stage $2^8$, it is 128 Hz; at terminal $T_9$ coupled to stage $2^9$, it is 64 Hz; at terminal $T_{10}$ coupled to stage $2^{10}$, it is 32 Hz; and at terminal $T_{11}$ coupled to stage $2^{11}$, it is 16 Hz.

In this embodiment of the invention, the frequencies 16 Hz to 32,768 Hz are each 16 times higher than the corresponding output frequencies of the test generator. Terminals $T_0$ to $T_{11}$ constitute the 12 contacts of a multi-contact selector switch 13. By manually adjusting switch 13, one can set the test generator to any one of twelve desired output frequencies, which are as follows:

| Switch Position | Divider Frequency (Hz) | Output Frequency |
| --- | --- | --- |
| $T_o$ | 32,768 | 2048 |
| $T_1$ | 16,384 | 1024 |
| $T_2$ | 8,192 | 512 |
| $T_3$ | 4,096 | 256 |
| $T_4$ | 2,048 | 128 |
| $T_5$ | 1,024 | 64 |
| $T_6$ | 512 | 32 |
| $T_7$ | 256 | 16 |
| $T_8$ | 128 | 8 |
| $T_9$ | 64 | 4 |
| $T_{10}$ | 32 | 2 |
| $T_{11}$ | 16 | 1 |

Thus the test generator is operative in a stepwise manner to produce frequencies in a range of 1 to 2048 Hz. This range is broad enough to encompass the usual signal range of a flowmeter from its minimum to its maximum flow rate.

Standard 10 produces a high-frequency output and the selectable counter 12 produces periodic pulses in an intermediate frequency range whose upper limit is the standard frequency, the pulses at each terminal $T_0$ to $T_{11}$ having a repetition rate which is a sub-multiple of the high-frequency standard and a predetermined multiple of the corresponding output of the test generator. In practice, in lieu of a selectable counter 12, use may be made of a programmable counter such as the CD 4059A Counter manufactured by RCA. This is a divide by N counter, permitting division of the standard frequency by any number.

The present invention seeks to realize by simple, inexpensive and reliable means, precise test frequencies in sinusoidal form but with a certain noise content in order to simulate flowmeter signals. But before considering how this objective is gained, it may be helpful to first outline two conventional techniques for obtaining the desired output.

One obvious approach is to generate a square wave of the desired frequency and to then filter the square wave to remove unwanted harmonics, thereby producing a sinusoidal wave. But because of the large frequency range involved, this technique, though workable, entails a multitude of components and switching actions. Moreover, the components required at the lower frequencies in the range would be quite large.

An alternative approach, which is also conventional, is to make use of a synthesizer functioning in the manner of a computer. The sine wave to be produced is analyzed to determine the amplitude appropriate for each segment thereof. The voltages necessary to create these segments and to synthesize the sine wave are then generated by a digital-to-analog converter. While this technique is extremely flexible, it also dictates elaborate and expensive instrumentation.

In the present invention, the desired sinusoidal output frequencies are developed by feeding pulses selected by switch 13 from binary counter 12 to a triangle generator, generally designated by numeral 14. The pulses of the selected repetition rate are fed into a four-bit binary counter 15 having stages $FF_1$ and $FF_2$ coupled to gate logic unit 16 and stages $FF_3$ and $FF_4$ coupled to a gate logic unit 17. The logic of these units is preferably formed by complementary MOS circuits in integrated form.

Gate logic unit 16, as best seen in FIG. 2, is constituted by AND/OR gates associated with resistors $R_F$, $R_E$ and $R_D$ of a ladder network. Gate logic unit 17 is constituted by NOR gates associated with resistors $R_C$, $R_B$ and $R_A$ of the ladder network. These gates are activated in response to the pulses applied to counter 15 to selectively connect the resistors of the ladder network between a common or ground terminal 18 and the positive pole of a battery or d-c power supply 19, the negative pole thereof being grounded.

The equivalent circuit of the ladder network and gate configuration is shown in FIG. 5 where it will be seen that each of resistors $R_A$ to $R_F$ is connected through a respective gate G to battery 19 in series with an output resistor $R_O$. Hence, when the gate for resistor $R_F$ is open and all other gates are closed, only this resistor is active in the battery circuit. Hence the voltage developed across output resistor $R_O$ is determined primarily by the ohmic value of resistor $R_F$ and the resultant voltage drop thereacross. If, however, the gates for resistors $R_B$ and $R_D$ are simultaneously open, then the resultant voltage drop is determined by the total resistance of active resistors $R_F$, $R_B$ and $R_D$ in shunt relation.

The resistors in the ladder network all have different values and therefore have different weights in terms of the voltages produced thereby. Thus when resistor $R_A$ is put into the circuit by its associated gate, it produces a different voltage drop from say resistor $R_C$ when it is operative.

It becomes possible, therefore, by selective actuation of the pattern of gates in the logic units, in response to the pulse count in counter 15, to produce across output resistor $R_O$ voltages which progressively step up and then progressively step down in magnitude and thereby create a triangular wave having a symmetrical staircase formation, as shown in FIG. 3.

In the embodiment shown, the ohmic values of the resistors forming the ladder network are as follows:

| | |
|---|---|
| $R_A$ | 10K |
| $R_B$ | 20K |
| $R_C$ | 23.2K |
| $R_D$ | 40.2K |
| $R_E$ | 80.6K |
| $R_F$ | 158K |

Figure 4:
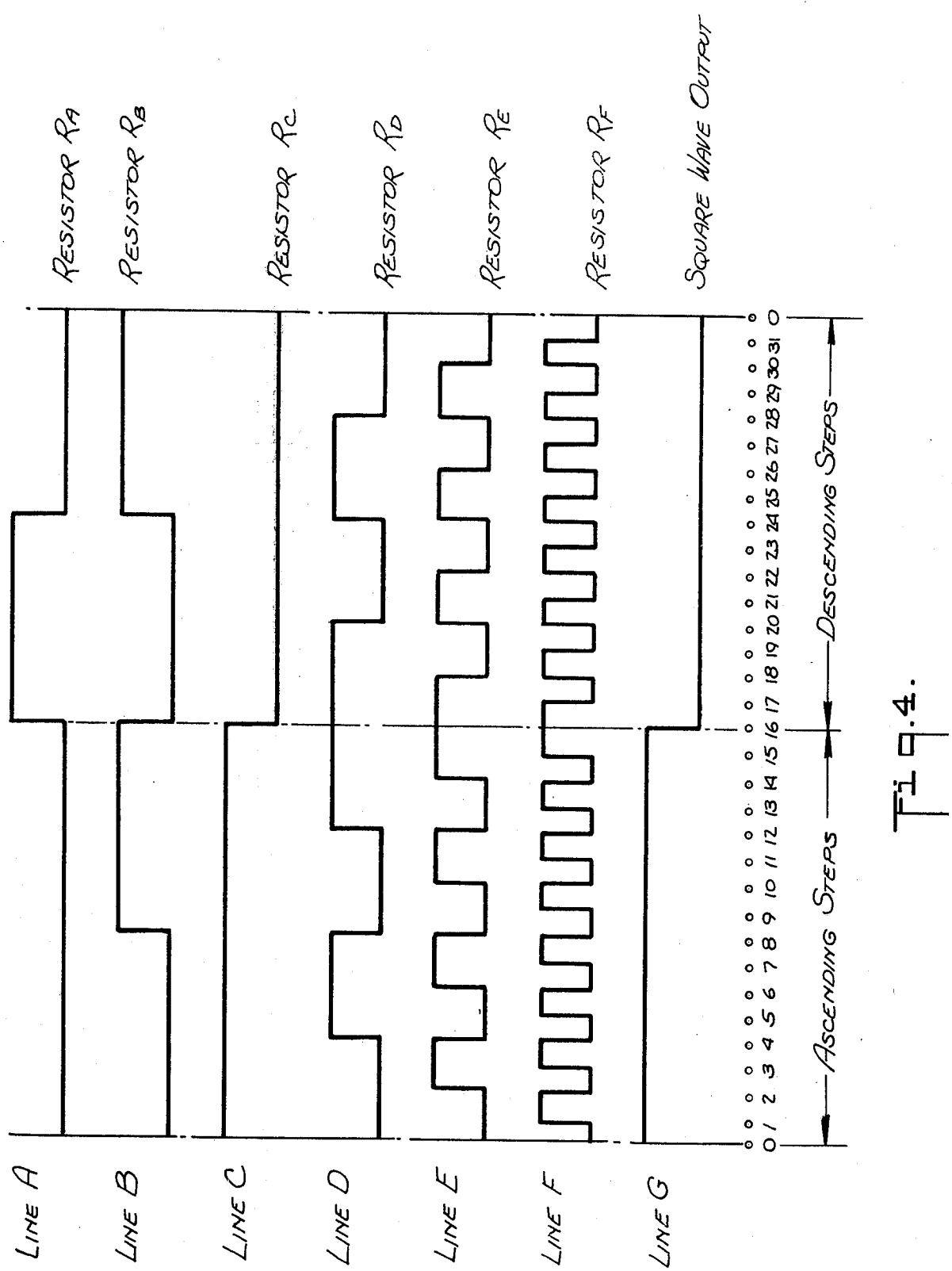
FIG. 4 is a timing diagram illustrating the behavior of the generator circuit at various points therein.

Gate logic units 16 and 17 associated with binary counter 15 (FF1, FF2, FF3 and FF4) are operatively coupled to resistors $R_A$ to $R_F$ of the ladder network act selectively to switch these resistors into and out of the battery circuit in a manner indicated by the timing diagram illustrated in FIG. 4. In this diagram, line A represents the voltage established at point A in the triangle generator in FIG. 2. This line reflects the "on" or "off" condition of resistor $R_A$ during a single cycle period defined by a succession of 32 steps.

The first 16 steps (1 to 16) represent the ascending steps of the staircase of the triangular wave TW yielded by triangular generator 14, while the succeeding 16 steps (17 to 0) represent the descending steps of the staircase.

Similarly, lines B to F in FIG. 4 represent the voltages established at points B to F, respectively, in triangle generator 14, these lines reflecting the on-off status of resistors $R_B$ to $R_F$ during the period defined by the 32 steps. It is to be noted that the 32 steps for each cycle of the triangular wave are in response to each train of 16 pulses supplied by the operative terminal ($T_0$ to $T_{11}$) of the selectable binary counter 12, each pulse producing two gate actions, one at the leading edge of the pulse and the other at the trailing edge thereof. Line G is the square wave derived from the last stage FF4 of counter 15, this square wave being made available at output terminal 20 of the test generator.

Thus for each train of sixteen pulses derived by division from the high-frequency standard, there is generated a single triangular wave TW having a 32 step staircase formation. The frequency of the triangular wave is a predetermined sub-multiple of the pulse repetition rate, the frequency in this instance being 1/16 of the repetition rate.

The purpose of the steps is to inject a realistic amount of noise in the final sine wave which is obtained in converter 21 by conversion of the triangular wave TW produced by triangle generator 14 into a sinusoidal wave SW. The staircase formation of the triangular wave is retained in the sinusoidal wave, and this acts as a noise component.

While in the embodiment disclosed herein the triangular way is made up of 32 steps, in practice a greater number may be used to more closely approach a perfect triangle and to thereby decrease the noise content of the output wave. Or the triangular form can be made coarser to increase the noise content.

In this regard, one can increase the number of stages in binary counter 15 and then associate with the added stages appropriate gates and resistors of different weights. If, therefore, resistor $R_A$ in the ladder network, which is 10K ohms, has a weight 1R, resistor $R_B$, which is 20K ohms, then has a relative weight of 2R, while resistor $R_F$, which is 158K ohms, has a weight of about 16R. The reason one does not use a 160K rather than a 158 ohm resistor to give exactly a 16R weight is only because of the commercial availability of stock resistors of 158K. In adding stages to counter 15, one can then use in conjunction with gates associated therewith, resistors having 32R, 64R, etc. weights.

As shown in FIG. 2, the output of triangle generator 14 is a-c coupled by a capacitor 22 to the triangle-to-sine wave converter 21. Converter 21 is provided with a non-linear shaping network constituted by diode 23 in series with resistor 24 in parallel relation with diode 25 in series with resistor 26, the diodes functioning as non-linear elements. When the voltage across each diode is low, it is non-conductive. As the amplitude of the voltage rises, the diode resistance progressively lowers until the resistor in series therewith becomes limiting.

Diode 23 and resistor 24 are active in the positive cycle while diode 25 and resistor 26 are active in the negative cycle. This shaping would not be possible had the all-positive voltage triangular wave TW not been a-c coupled to converter 21 to swing negative and positive in relation to common.

The resultant sinusoidal wave SW having a staircase noise component is applied to an interface network 27 to interface the test frequencies with specific instruments. Thus terminal 28 of this network provides an interface output for a turbine flowmeter, terminal 29 for a Swirlmeter and terminal 30 for a vortex-type meter.

It will be evident from the nature of the test generator that most of the stages thereof may be constituted by small integrated circuit chips, so that the entire generator, including the battery 19 and a test meter 31 therefor, can be contained in a highly-compact portable package in which the only panel controls are a power switch 32 for connecting the battery to the generator circuit or to battery test meter 31 and selector switch 13, which is settable to give the desired output frequency. Thus if one wishes to check the flowmeter by simulating a 4 Hz signal, one simply turns the selector switch to the 4 Hz contact.

While there has been shown and described a preferred embodiment of a precision test frequency generator in accordance with the invention, it will be appreciated that many changes and modifications may be made therein without, however, departing from the essential spirit thereof.

I claim:
1. A precision test generator producing sinusoidal output waves in a predetermined range to simulate the output of an instrument yielding a sinusoidal signal within said range, said sinusoidal signal having a noise component superimposed thereon, said test generator comprising:
  A. a stable-frequency standard having a predetermined high-frequency;
  B. means coupled to said standard to divide the frequency thereof to produce intermediate frequency pulses whose repetition rate is a selected sub-multiple of said high frequency and a predetermined multiple of the desired output frequency of the test generator within said range, said divider means being constituted by a multi-stage counter provided with a multi-contact selector switch whose contacts are connected to the respective stages of the counter to derive pulses of the desired repetition rate;

C. a triangle generator responsive to said pulses to produce a triangular wave whose frequency corresponds to the desired output frequency, said triangular wave having a staircase formation whose number of steps is determined by said multiple; and D. means coupled to said triangle generator to transform said triangular wave into a sinusoidal output wave of the same frequency with a staircase component simulating said signal.

2. A test generator as set forth in claim 1, wherein said standard is a crystal-controlled oscillator.

3. A test generator as set forth in claim 1, wherein said high-frequency is about 30,000 Hz.

4. A test generator as set forth in claim 3, wherein said test generator produces output frequencies in the range of 1 to about 2000 Hz.

5. A test generator as set forth in claim 1, further including an interface network coupled to said transforming means to interface said sinusoidal output wave with particular forms of flowmeters.

6. A test generator as set forth in claim 1, wherein said triangle generator includes a ladder network of resistors having different values, and means including a counter responsive to said pulses to selectively connect said resistors to a voltage source to produce an output voltage which progressively rises to create the ascending steps of the staircase and then progressively falls to create the descending steps thereof.

7. A test generator as set forth in claim 6, wherein said means for selectively connecting the resistors to the source is constituted by gate logic units associated with said counter.

* * * * *